United States Patent Office 3,307,972

Patented Mar. 7, 1967

3,307,972

ELECTROLESS COPPER DEPOSITION

Robert A. Ehrhardt, New Providence, N.J., assignor to Bell Telephone Laboratories, Incorporated, New York, N.Y., a corporation of New York No Drawing. Filed Mar. 11, 1963, Ser. No. 264,060
4 Claims. (Cl. 117—130)

This invention relates to a process and novel solution for the electroless deposition of copper by chemical reduction.

Electroless deposition presents various advantages over conventional electroplating techniques. Particular interest in electroless techniques has arisen in the area of printed circuit manufacture. The supports or boards for the printed circuit are initially insulating. Since the circuit itself is typically electrodeposited, the board must first be provided with a conductive surface. One of the more attractive methods for obtaining the initial conductive layer is by chemical deposition. Current technology, particularly in the area of miniaturization and integrated circuits, often demands the utilization of both sides of the printed circuit board. For this purpose connections made through the thickness of the board are often used. However, this introduces several difficulties, among which are the difficulty of drilling suitably smooth holes in laminated plastic, the degradation of insulation resistance due to absorbed electrolyte and, where silver is used to make the surfaces of the holes conductive, the danger of silver migration.

The first two of these objects have been met by the development of a new type of printed circuit board which is described and claimed in United States application Serial No. 220,383 filed August 30, 1962, now abandoned. This board consists, for instance, of a predrilled metal sheet coated with epoxy resin. The resultant holes are smooth and bellmouthed, ideally suited for plating through, and present an unbroken plastic surface resistant to penetration by electrolyte. The last objection can be eliminated by using a metal other than silver as the initial conductive coating.

Copper is ideally suited for this purpose since it has good conductivity and can be easily etched away to form the desired circuit pattern. Processes for the electroless deposition of copper are known in the art. However, copper is very readily reduced and the prior art plating solutions are extremely unstable and unsuitable for continuous use. Consequently, prior art electroless copper deposition methods are typically batch processes wherein the plating solution is mixed just prior to using. Since the mixed solution spontaneously decomposes and has an active life numbered in hours, the work must be processed as rapidly as possible and since the rate of deposition decreases with the age and usage of the mixture, a variable processing schedule must be established. The spent solutions are usually not recovered. Thus, the need for a stable solution is evident.

The present invention is directed to a stable electroless copper plating solution with a shelf life of from several days to several weeks. The solution is essentially a novel formulation of active ingredients and stabilizers which are effective within a given pH range.

The novel solution may be represented by the following prescribed ingredients and relative proportions:

TABLE 1

| | | |
|---|---|---|
| Copper sulfate pentahydrate | g./l. | 10–30 |
| Versene (ethylene diamine tetra-acetic acid) | g./l. | 25–200 |
| Trisodium phosphate (anhydrous) | g./l. | [1] 25 |
| Methyl alcohol | ml./l. | 20–100 |
| Triethanolamine | ml./l. | 10–35 |
| Formaldehyde (38%) | ml./l. | 5–50 |

[1] To solubility limit.

This solution generally gives a pH of 11.0 to 12.0 which is considered desirable for obtaining a good quality plate at a useful rate. The solution may be adjusted with NaOH to give the desired pH value. A pH value of 11.3 to 11.5 has been found particularly effective. The formaldehyde has been expressed as 38% for convenience as that is the standard reagent. However, solutions having different concentrations obviously may be used to give an equivalent amount of formaldehyde. Accordingly the designation 38% used herein and in the appended claims is intended to include such direct equivalents.

The use of the novel solution is illustrated by the following example:

*Example I*

| | | |
|---|---|---|
| Copper sulfate pentahydrate | g./l. | 25 |
| Versene (EDTA) | g./l. | 100 |
| Trisodium phosphate | g./l. | 100 |
| Methyl alcohol | ml./l. | 50 |
| Triethanolamine | ml./l. | 15 |
| Formaldehyde (38%) | ml./l. | 20 |

Electroless copper deposition was carried out in a scratch-free, one-liter, tall-form, glass beaker containing one liter of the above solution. A constant temperature of 60° C. was maintained in the solution by means of a 250 watt infrared lamp and a thermistor temperature controller unit. The lamp was positioned approximately 1.5 in. from the side of the beaker and directed toward the top half of the solution.

A 12 in.$^2$ platinum electrogravimetric analysis electrode was selected as the test specimen and was used throughout the entire evaluation although nonmetal surfaces (such as the aforementioned epoxy printed circuit boards) sensitized in the usual manner to be catalytic to the electroless solution can also be plated according to this procedure. To insure proper heat distribution the electrode was immersed in the solution between the thermister probe and the heat source. The solution yielded 2 milligrams of copper per square inch of electrode surface per minute 60° C. The solution was filtered at 30° C. and stored at room temperature for several weeks. After this time period no significant change in its plating effectiveness could be detected. It was found that the solution was useful between 30° C. and 70° C. Higher temperatures tend to initiate spontaneous decomposition of the solution. At lower temperatures the deposition rate is too slow to be useful.

Various additions and substitutions for the constituents in Table I will be readily apparent to those skilled in the art. For instance, the substitution of ethyl alcohol for methyl alcohol and the use of similar amines such as diethyl amine as an alternative to triethanolamine give satisfactory results and are considered within the scope of this invention.

Various other modifications and extensions of this invention will become apparent to those skilled in the art. All such variations and deviations which basically rely on the teachings through which this invention has advanced the art are properly considered within the spirit and scope of this invention.

What is claimed is:

1. A method for electroless plating with copper comprising the step of contacting a metal surface or a sensitized nonmetal surface with an aqueous plating solution catalyzed by said surface at a temperature of 30° C. to 70° C. said solution having a pH value of 11.0 to 12.0 and consisting essentially of:

| | | |
|---|---|---|
| Copper sulfate pentahydrate | g./l. | 10–50 |
| Ethylenediamine-tetra-acetic acid | g./l. | 25–200 |
| Trisodium phosphate (anhydrous) | g./l. | [1] 25 |
| Methyl or ethyl alcohol | ml./l. | 20–100 |
| Triethanolamine | ml./l. | 10–35 |
| Formaldehyde (38%) | ml./l. | 5–50 |

[1] To solubility limit.

2. A method for electroless plating with copper comprising the step of contacting a metal surface or a sensitized nonmetal surface with an aqueous plating solution catalyzed by said surface at a temperature of 30° C. to 70° C. said solution having a pH value of 11.0 to 12.0 and consisting essentially of:

| | | |
|---|---|---|
| Copper sulfate pentahydrate | g./l. | 25 |
| Ethylenediamine-tetra-acetic acid | g./l. | 100 |
| Trisodium phosphate (anhydrous) | g./l. | 100 |
| Methyl alcohol | ml./l. | 50 |
| Triethanolamine | ml./l. | 15 |
| Formaldehyde (38%) | ml./l. | 20 |

3. An electroless copper plating solution consisting essentially of:

| | | |
|---|---|---|
| Copper sulfate pentahydrate | g./l. | 10–50 |
| Ethylenediamine-tetra-acetic acid | g./l. | 25–200 |
| Trisodium phosphate (anhydrous) | g./l. | [1] 25 |
| Methyl or ethyl alcohol | ml./l. | 20–100 |
| Triethanolamine | ml./l. | 10–35 |
| Formaldehyde (38%) | ml./l. | 5–50 |

[1] To solubility limit.

and having a pH value of 11.0 to 12.0.

4. An electroless copper plating solution consisting essentially of:

| | | |
|---|---|---|
| Copper sulfate pentahydrate | g./l. | 25 |
| Ethylenediamine-tetra-acetic acid | g./l. | 100 |
| Trisodium phosphate (anhydrous) | g./l. | 100 |
| Methyl alcohol | ml./l. | 50 |
| Triethanolamine | ml./l. | 15 |
| Formaldehyde (38%) | ml./l. | 20 |

and having a pH value of 11.0 to 12.0.

References Cited by the Examiner

UNITED STATES PATENTS

| | | | |
|---|---|---|---|
| 2,874,072 | 2/1959 | Cahill et al. | 117—130 |
| 2,938,805 | 5/1960 | Agens | 117—130 X |
| 3,075,855 | 1/1963 | Agens | 117—130 X |
| 3,075,856 | 1/1963 | Lukes | 117—130 X |
| 3,119,709 | 1/1964 | Atkinson | 117—35 X |

ALFRED L. LEAVITT, *Primary Examiner.*

RALPH S. KENDALL, *Examiner.*